Oct. 11, 1966 J. R. FAHEY 3,278,813

TRANSISTOR HOUSING CONTAINING PACKED, EARTHY, NONMETALLIC, ELECTRICALLY INSULATING MATERIAL

Filed April 22, 1964

INVENTOR:
JOHN R. FAHEY,

BY Robert J. Mooney

HIS ATTORNEY.

United States Patent Office 3,278,813

Patented Oct. 11, 1966

3,278,813

TRANSISTOR HOUSING CONTAINING PACKED, EARTHY, NONMETALLIC, ELECTRICALLY INSULATING MATERIAL

John R. Fahey, Camillus, N.Y., assignor to General Electric Company, a corporation of New York Filed Apr. 22, 1964, Ser. No. 361,645

4 Claims. (Cl. 317—234)

This invention relates to improvements in junction semiconductor devices having a body of semiconductor material enclosed in an encapsulant. More particularly, the invention relates to an improved low cost transistor.

Transistors are known in which a pellet of semiconductor material is mounted on a metallic member which may serve as all or part of the electrical connector or external lead from one of the functionally significant regions of the transistor, such as the emitter or base or collector region. Other electrical connectors such as wires or other electrically conductive members are connected to the other functionally significant regions of the pellet, and may in turn be attached to, or may themselves constitute, additional external electrical leads of the device. In such transistors the assemblage, including the pellet and at least a portion of the electrical connectors thereto, is encapsulated or potted in a suitable electrically insulative material such as an epoxy resin from which the outer portions of the external leads extend. The external leads may additionally extend through a header of electrically insulative material such as a phenolic resin which serves to support, space, and orient the leads, and the encapsulating material may desirably extend to and form an encasement integrally joined to the header.

Although the semiconductor pellet in such devices is generally of the type wherein its electrically significant regions are at least partly protected from contamination by moisture and other environmental impurities by a protective coating carried directly by the semiconductor material itself, such as a thin layer of oxide of silicon in the case of a silicon pellet, the purpose of encapsulation or potting is to provide further permanent protection against mechanical and thermal shock, chemical attack or the like, and to ruggedize the device so as to simplify subsequent handling, packaging, shipping, and use.

One of the problems that has been encountered with this type of device is that during electrical operation under conditions wherein PN junction temperatures within the pellet exceed about 100° C., epoxy resin encapsulating materials heretofore employed contiguous to the pellet may become chemically reactive with the pellet sufficiently to degrade some of the electrical parameters of the pellet. This degradation has been observed for example as a decrease in D.C. beta or $h_{FE}$ of transistor devices (D.C. beta being defined as the common-emitter forward large-signal current gain). Manifestly, degradation of such parameters as transistor D.C. beta is quite undesirable for many circuit applications, and the present invention is directed to improvements which prevent or substantially eliminate degradations of this kind.

Accordingly, one object of the present invention is to provide improved junction semiconductor devices of the encapsulated or potted type having improved performance at high junction temperatures in the vicinity of 100° C. and above.

Another object is to provide a transistor of the foregoing character wherein the degradation of the D.C. beta at junction operating temperatures at or above 100° C. is minimized.

Another object is to provide improved junction semiconductor devices of the foregoing character wherein the foregoing advantages are obtained with a minimum addition to the cost of the device and with a minimum of change or disruption of process or assembly steps heretofore employed in the manufacture of such devices.

Another object is to provide a low cost transistor of the epoxy resin encapsulated type in which chemical reaction with, or degradation of, the semiconductor pellet by the epoxy resin encapsulant is substantially precluded.

These and other objects of the invention will be apparent from the following description and the accompanying drawing wherein.

Figure 1:
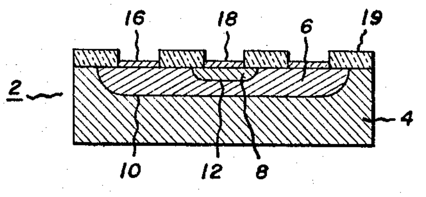
FIGURE 1 is an enlarged sectional view of the semiconductor pellet portion of a transistor to which my invention is particularly applicable.
Figure 2:
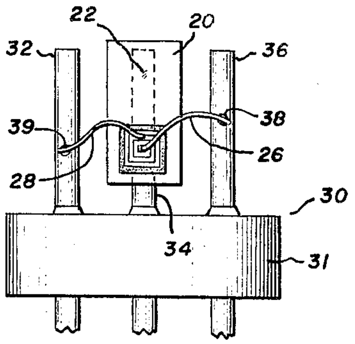
FIGURE 2 is a fragmentary view of a transistor utilizing the pellet of FIGURE 1, and at an intermediate stage of manufacture.

Referring to the drawing, a transistor constructed in accordance with the present invention includes an electrically active element consisting of a body or pellet 2 of semiconductor material such as silicon, of wafer-like form having a thickness of, for example, 5 to 8 mils and having an area of, for example, 100 to 400 square mils. The pellet has a plurality of electrically active regions which may include, for example, a collector region 4, base region 6, and emitter region 8. The pellet may be suitably treated with additives or impurities, for example, by impurity diffusion, so that the base region 6 is of opposite conductivity type to that of the emitter region 8 and collector region 4, thus defining a pair of PN junctions, indicated generally at 10 and 12, within the pellet. The pellet may include, for example, a collector region 4 of N-type silicon, a P-type base region 6 formed by diffusion into the pellet of an impurity such as boron, and an N-type emitter region 8 formed by diffusion into the base region of an impurity such as phosphorus. Conductive coatings, for example of aluminum, are applied to the base and emitter regions, respectively, to form non-rectifying contacts 16, 18 facilitating attachment of respective leads thereto. At the surface of the pellet, between the emitter and base contacts 16, 18 and over the intersection of the loci of the junctions 10, 12 with the pellet surface, the pellet is provided with a protective covering 19 of insulative material, which in the case of a silicon pellet may conveniently consist of an oxide of the silicon.

The pellet is mounted on a carrier 20 which may consist, for example, of Kovar or steel, having a ribbon-like cross section of, for example, 50 mils in width and 5 to 10 mils in thickness. The major face of the pellet opposite that of the base and emitter contact regions 16, 18 is permanently conductively secured to carrier 20 as, for example, by soldering or welding to provide a non-rectifying conductive contact. To facilitate the attachment of the pellet to the carrier, an intermediate layer of a metal 24, such as gold or gold doped with an impurity of the same conductivity type as the collector region of the pellet, may be employed to form a solder between the carrier 20 and the pellet 2.

An emitter lead 26, such as a segment of wire of gold or other suitable metal having a diameter of the order of 1 mil, is permanently secured at one of its ends in non-rectifying electrical contact to the emitter contact 18 of the pellet, for example, by the technique known in the art as thermal-compression-bonding. A similar base lead 28 is likewise secured to the base contact 16.

The carrier 20 is mechanically and electrically conductively attached as by a weld 22 to the center post 34 of the header assembly 30 including a disk of electrically insulative material 31, such as a phenolic, through which the center post 34 extends. Likewise extending through the disk 31 are side posts 32 and 36 to which the base lead 28 and emitter lead 26 are respectively secured as by welds 39, 38. The header 30 may serve as a permanent or temporary support for maintaining the spacing and relative position of the external leads constituted by the three posts 32, 34 and 36.

Figure 4:
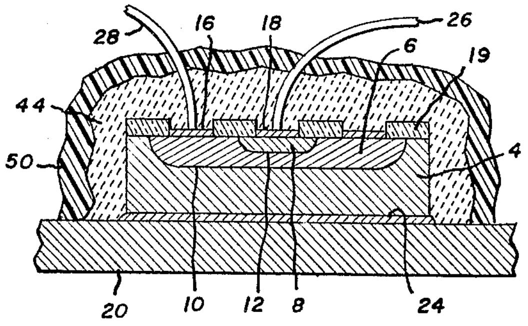
FIGURE 4 is an enlarged fragmentary sectional view of a portion of the structure of FIGURE 3.

Ultimately, in the manufacture of the device herein described, the semiconductor pellet 2 and the portions of its leads adjacent thereto are encapsulated or potted in an insulative encasement 50 of a material such as an epoxy resin, as will hereinafter be described. However, prior to this encapsulating step, in accordance with my invention, the assemblage of pellet and adjacent increments of its electrical leads, as shown in FIGURE 4, is covered by a layer of material which serves as a separator 44 to keep the encapsulating or potting material 50 out of direct contact with the semiconductor pellet.

The separator material must be electrically insulative and chemically non-reactive with the encapsulating material and other contiguous materials. It is also important that the separator material be non-ionizable, make a satisfactory thermal expansion coefficient match with the semiconductor pellet, encapsulant, and other contiguous materials so as to avoid fracture during thermally responsive changes in dimensions, not melt below about 200° C., and not fuse to or otherwise deleteriously affect the other materials directly applied to the semiconductor pellet such as coating 19. In general, various earthy non-metallic materials meeting the above requirements, such as oxides, nitrides, carbonates and silicates, are acceptable separator materials. However, it has been found that materials whose particles tend to have a plate-like shape, as opposed to spheroidal, angular or fibrous, seem to be more effective in blocking gassy or liquid contaminants evolved from the encapsulant at high temperatures of about 150° C.

A preferred separator material has been found to be boron nitride, this preference being based on electrical tests of finished transistors and measuring leakage currents such as $I_{CBO}$ and $I_{EBO'}$ and shift of D.C. beta with temperature. Another preferred separator material formulation is:

Feldspar, $Na_2K_2O$, $Al_2O_3$-$4SiO_2$, 69% by weight.
Air floated clay, $Al_2O_3$-$2SiO_2$, 29% by weight.
Bentonite, $Al_2O_3$-$2SiO_2$, 2% by weight.

Figure 6:
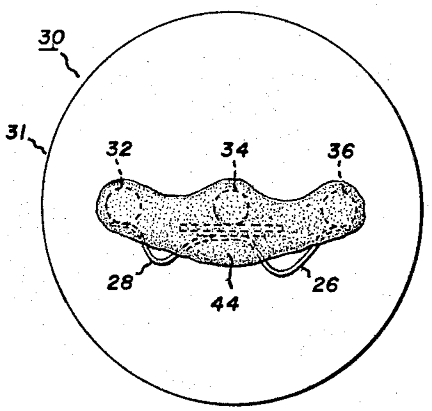
FIGURE 6 is a view similar to FIGURE 5, illustrating a different form of the application of my invention.
Figure 5:
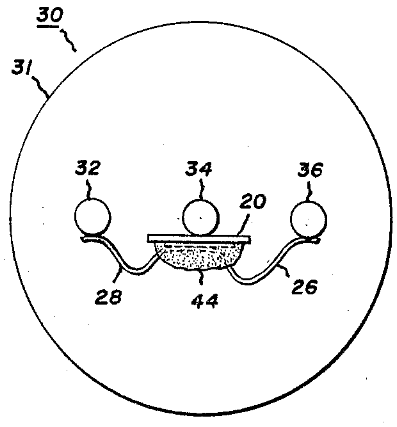
FIGURE 5 is a top view of a structure similar to that shown in FIGURE 2, after further processing according to my invention.

The separator 44 may be applied in any suitable manner such as by brushing, spraying, dipping, extruding, or electrophoresis. A preferred way of applying separator 44 is by dip-coating in a slurry of finely divided particulate separator material in a suitable vehicle. A satisfactory slurry formulation is 98 parts by weight finely divided boron nitride powder, 2 parts by weight of a deflocculating agent such as finely divided bentonite, the boron nitride and bentonite having a particle size of about 40 to 50 microns, or small enough to pass through a mesh having 325 openings per linear inch, and 100 parts by weight deionized water. The assemblage of pellet 4 and adjacent portions of leads 26, 28 may be dipped into a bath of such a slurry to form a coated separator 44 as shown in FIGURE 6. After its application in slurry form, the separator 44 is allowed to solidify by drying in air in a convection oven at about 150° C. for about one hour.

Figure 3:
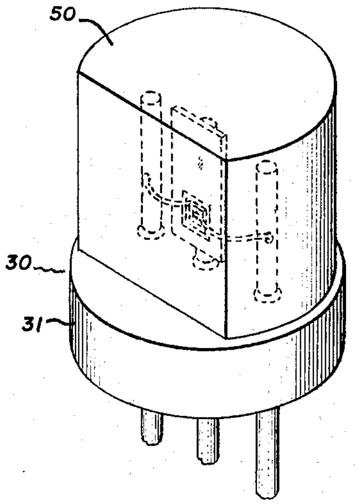
FIGURE 3 is a perspective view showing the structure of FIGURE 2 after manufacture is completed according to my invention.

Once the separator layer is dry, the final step of encapsulating the device in the exterior encapsulant 50 may be performed. A preferred encapsulant 50 is an epoxy resin molding compound having desirably high imperviousness to moisture. The encapsulant 50 should also preferably make a good thermal expansion coefficient match with the materials which it encloses, and, if the header 30 is to be permanently retained, with the material of the header. One suitable encapsulant is an acid anhydride-hardenable resin known by the trade name "D.E.N. QX-2638.1" and commercially available from the Dow Chemical Company. This resin, when mixed with a polycarboxylic acid anhydride hardner, such as that known by the trade name "Nadic Methyl" available commercially from the General Chemical Company, and a low viscosity diluent such as that known by the trade name "Unox 206" commercially available from the Union Carbide Company, can be cast or molded in place as shown in FIGURE 3, and suitably cured or hardened by heating for a few hours at 100° C. Use of a known catalyst for resins, such as benzl-dimethyl amine, will reduce curing time. Other encapsulating materials, such as glass or a radiation-opaque material such as lead may also be employed.

A transistor device constructed according to my invention has many advantages. Though not necessarily in itself mechanically strong or permanently rugged enough to stap in place, the separator material 44 is locked by the encapsulant 50 in place so as to provide a permanent spacer or barrier separator permanently preventing contact and chemical interaction between the encapsulant and the pellet. Furthermore, the separator material is substantially completely impervious to the passage of gassy or liquid contaminants or other deleterious materials which may be evolved from the encapsulant during operation of the transistor at high junction temperature. Hence, the separator effectively minimizes chemical interaction of the encapsulant or other materials with the pellet and thereby effectively precludes electrical or chemical degradation of the pellet from such causes even at high junction temperatures in the range of 100 to 150° C. or higher. The separator thus decreases the importance of chemical activeness of the encapsulant as a factor in choice of encapsulant, allowing a wider latitude in encapsulant chemical properties and enabling the encapsulant to be optimized for thermal and mechanical properties such as good thermal conductivity and expansion matching, and increased resistance to shock and vibration. The cost of the separator is relatively insignificant and it is easy to apply, yet its presence not only increases device tolerance to momentary excessive electrical stress, but also materially improves the long-term operating characteristics of junction semiconductor devices subject to such thermo-chemically induced electrical degradation, particularly at the high junction temperatures associated with high power operation, thereby providing improved longer life, higher reliability junction semiconductor devices.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What I claim as new and desire to secure by Letters Patent of the United States is:

1. A P-N junction semiconductor device comprising a body of semiconductor material containing a P-N junction, a film of an oxide of said semiconductor material on the semiconductor body and covering said P-N junction, a body of encapsulating material protectively enclosing at least a portion of the exterior of said semiconductor body, and another layer of finely-divided particulate inorganic non-ionizable earthy non-metallic electrically insulative material having a melting point higher than 200° C. separating said encapsulating material from contact with any portion of said semiconductor body or film, said separating layer being chemically non-reactive with said semiconductor material and chemically non-reactive with said capsulating material.

2. A P-N junction semiconductor device comprising a body of semiconductor material containing a P-N junction, a body of encapsulating material protectively enclosing at least a portion of the exterior of said semiconductor body, and a separating layer of essentially packed plate-like particles of boron nitride disposed between said encapsulating material and said semiconductor body.

3. A device as defined in claim 1 wherein said layer consists essentially of a mixture of feldspar, air floated clay, and bentonite.

4. A device as defined in claim 1 wherein said encapsulating material comprises an acid-anhydride-hardened epoxy resin and said layer consists essentially of packed plate-like particles of boron nitride.

References Cited by the Examiner

UNITED STATES PATENTS

| | | | |
|---|---|---|---|
| 2,913,358 | 11/1959 | Harrington et al. | 117—200 |
| 3,200,310 | 8/1965 | Carman | 317—234 |
| 3,212,160 | 10/1965 | Dale | 29—25.3 |

JOHN W. HUCKERT, *Primary Examiner.*

M. EDLOW, *Assistant Examiner.*